United States Patent [19]

Hennessy et al.

[11] Patent Number: 5,232,091

[45] Date of Patent: Aug. 3, 1993

[54] SEMICONDUCTOR DEVICE SHIPPING CONTAINER

[75] Inventors: James M. Hennessy, Conesus; Robert L. Nielsen, Pittsford, both of

[73] Assignee: Eastman Kodak Company, Rochester, N.Y.

[21] Appl. No.: 965,114

[22] Filed: Oct. 22, 1992

[51] Int. Cl.$^5$ ............................................. B65D 85/38
[52] U.S. Cl. .................................... 206/331; 206/328
[58] Field of Search ................................ 206/328-334

[56] References Cited

U.S. PATENT DOCUMENTS

| | | | |
|---|---|---|---|
| 3,774,075 | 11/1973 | Medesha | 317/2 R |
| 4,241,829 | 12/1980 | Hardy | 206/328 |
| 4,382,509 | 5/1983 | Gordon | 206/331 |
| 4,463,851 | 8/1984 | Cecil | 206/328 |
| 4,564,880 | 1/1986 | Christ et al. | 361/212 |
| 4,565,288 | 1/1986 | Walther | 206/328 |
| 4,585,121 | 4/1986 | Capelle, Jr. | 206/331 |
| 4,590,534 | 5/1986 | Akamatsu et al. | 361/212 |
| 4,615,441 | 10/1986 | Nakamura | 206/329 |
| 4,706,161 | 11/1987 | Buckingham | 361/220 |
| 4,815,596 | 3/1989 | Reid | 206/334 |
| 5,012,924 | 5/1991 | Murphy | 206/331 |
| 5,014,849 | 5/1991 | Becker | 206/328 |
| 5,108,299 | 4/1992 | Cronin | 439/188 |
| 5,109,981 | 5/1992 | Maston, III et al. | 206/331 |
| 5,150,786 | 9/1992 | McAllister | 206/334 |

*Primary Examiner*—Jimmy G. Foster
*Attorney, Agent, or Firm*—Stephen C. Kaufman

[57] ABSTRACT

A container is described which is useful for handling, storing, and shipping various packaged circuits (e.g., integrated circuits) including dual-in-line plastic (DIP) packages and dual-in-line ceramic (DIC) packages. The containers have a hump like structure shaped to accommodate the dual-in-line packages and have a conducting strip along each side of the container. With the container in an open position, the packages are free to slide along the hump-like structure which facilitates loading and unloading packaged circuits. When the container is in a closed position, the conducting strips press against the pins of the packaged circuits providing electrical contact between each pin in a row and holding the circuit packages securely in place. The containers provide excellent protection against damage from electrical discharge, are extremely convenient for loading and unloading packaged circuits, and are relatively inexpensive.

4 Claims, 4 Drawing Sheets

//\# SEMICONDUCTOR DEVICE SHIPPING CONTAINER

FIELD OF THE INVENTION

The present invention relates to containers useful for shipping and handling a plurality of packaged integrated circuits such as plastic dual-in-line packages (DIPs) or ceramic dual-in-line packages (DIPs) which contain semiconductor integrated circuits (ICs). The containers are particularly unique in that they protect the packages against damage from electrostatic discharge as well as mechanical damage and serve as convenient receptacles for shipping and handling a number (typically about one or two dozen), of circuit packages.

BACKGROUND OF THE INVENTION

Rapid advances in semiconductor technology, particularly in the trend toward sub-micron geometry, have resulted in greater sensitivity of packaged semiconductor devices to damage from electrostatic discharge. Protecting advanced semiconductor devices against electrostatic discharge during shipping and handling is essential to maintaining high reliability. Such protection is often expensive and frequently becomes a significant factor in the cost of the semiconductor device.

Conventionally packaged integrated circuits (e.g., semiconductor dual-in-line plastic and ceramic packages each having a pair of parallel rows of conductors protruding from a package in which an integrated circuit is housed) are shipped in tube-shaped containers often called DIP tubes (tubular containers). Typically, these DIP tubes are made up of extruded polyvinyl chloride (PVC) or other extrudable material. The DIP tubes protect the packaged circuits against damage or contamination during shipping and handling. The internal shape of the tubular containers are typically selected so as to facilitate the use of efficient and convenient handling procedures. For example, with dual-in-line packages, the inside of the tube containers might have a hump-like structure over which the packages can slide. Such a structure permits the use of convenient handling procedures and permits mechanical handling of the packages. Also, the tubular containers are quite inexpensive and can be reused.

However, for packaged integrated circuits that are sensitive to electrostatic discharge, these DIP tubes do not provide sufficient protection against damage from electrostatic discharge.

Some electrostatic protection is provided by the use of conductive plastic in the manufacture of shipping containers. This type of electrostatic protection has certain advantages. For example, since the DIP tubes have the same shape as conventional containers, the same handling procedures can be used as with DIP tubes. However, conductive container structures often do not provide adequate protection for circuit packages that are extremely sensitive to electrostatic discharge. In addition, there may be abrasion between the dual-in-line packages and the conductive plastic of the tubular container which can result in particulate contamination. This may cause a reliability problem with electro-optic or imaging integrated circuits.

Better electrostatic protection is provided by inserting the pins of the packaged integrated circuit into conductive foam to provide direct electrical contact between the pins. A packaged circuit is inserted into conductive foam and then the combination is put into a box (container) for shipping and handling. Although this type of shipping container provides excellent protection against damage from electrostatic discharge, handling procedures are much less convenient principally because the circuit package must be individually lifted out of the conductive foam and the circuit package can not be inserted into or removed from the shipping box by sliding along a rail. Also, conductive foam is expensive and the cost of this type of shipping and handling container is significantly higher than the conventional tubular container. In a technology where price competition is very great, higher costs for containers is highly disadvantageous.

A number of references disclose containers for handling small sensitive electronic components. Particularly relevant is U.S. Pat. No. 4,382,509 (Bertram I. Gordon), issued May 10, 1983, which discloses a container made up of cardboard having a conductive metallic coating on the surface. The container has a portion (i.e., a hump or rail) on which electronic components are securely placed so that the pins or connecting lugs protrude from the electronic component are all electrically interconnected by the metallic coating. Electrical interconnection of the pins or lugs by the metallic coating prevents build-up of static electricity which might damage the electronic component. Although this type of container protects against damage from static electricity, the electronic components do not slide along the hump or rail which makes handling much less convenient and precludes mechanical handling. Also, the abrasion between pins and hump often damages the circuit packages and causes contamination of the circuit packages. In addition, the conductive metallic coating and the metallic clips used to close the container makes the cost of the container relatively high considering the competitive nature of the semiconductor device field.

U.S. Pat. No. 4,706,161 (John S. Buckingham), issued Nov. 10, 1987, discloses a protective apparatus for electrical devices having coplanar leads which provides both mechanical and electrostatic discharge protection. The protective apparatus is essentially a socket and carrier type device with circuit chips mounted on a ceramic substrate. Although affording excellent mechanical and electrostatic protection, the protective device is relatively expensive and does not lend itself to easy handling of the protected electronic devices.

U.S. Pat. No. 4,564,880 (Allen E. Christ et al.), issued Jan. 14, 1986, discloses a carrier for integrated circuits having uniform conductivity and an arrangement to securely hold the integrated circuit in a predetermined position within the carrier. The carrier includes a hinge arrangement and a latching system. This carrier is relatively expensive, and because the integrated circuit is securely held in place, it does not lend itself to easy handling of the packaged circuits contained in the carrier. The integrated circuit package carrier disclosed in U.S. Pat. No. 4,615,441 (Ryuichi Nakamura), issued Oct. 7, 1986, has similar limitations.

U.S. Pat. Nos. 4,815,596 (Steven J. Reid), issued Mar. 28, 1989, discloses a circuit component carrier useful for housing a single dual-in-line integrated circuit package. The carrier comprises a box-like shell and cover which are hinged together. The shell comprises a rectangular bottom wall and side walls forming a receptacle. Projecting from the bottom wall and into the shell are spaced walls adapted to fit between the dual rows of pin on the circuit package. The carrier is molded from an electrically conductive polymeric composition, typically a polyallylomer loaded with carbon particles. This carrier is expensive and accommodates only one circuit package for each carrier. Also, the design does not permit easy handling of the components being carried.

Similar limitations exist for containers disclosed in two other references, namely, U.S. Pat. No. 4,241,829 (Charles T. Hardy), issued Dec. 30, 1980, and U.S. Pat. No. 4,585,121 (Ernest A. Capelle, Jr.), issued Apr. 29, 1986. The Hardy patent discloses a container useful for handling and shipping of electrostatic sensitive electronic components made up of a box-like carton with interior and exterior surfaces coated with conductive material. A liner of convoluted foam impregnated with a conductive material is secured to the interior surfaces of the lid and the bottom of the box-like carton, the impregnated conductive material forming a continuous conductive path with the conductive coating. This container does not lend itself to easy and convenient handling of the packages stored therein since each individual package must be inserted and removed from the container. Also, the containers are quite expensive. The Capelle, Jr. patent discloses a container for storing and handling multichip hybrid packages during manufacture, testing and inspection. The receptacle and cover are recessed to receive a wide range of component sizes and shapes. The container is made of electrically conductive, high temperature resistant carbon plastic for protection from electrostatic discharges and environmental temperature chamber testing. The container only affords limited protection against damage from static electricity and is designed largely to observe electronic devices during testing.

U.S. Pat. No. 3,774,075 (Alfred L. Medesha), issued Nov. 20, 1973, discloses a package for storage and shipping of electrical equipment in which the package includes an element for shorting the electrical equipment. The patent describes a tubular short circuiting part made of conduction material for temporarily holding integrated circuits immediately after removal from the shipping package and before incorporation into electrical equipment.

Various shipping containers made in the form of tubes useful for shipping static-sensitive electrical components are known. These tubes are typically made of electrically conductive material. For example, U.S. Pat. No. 5,014,849 (Raymond P. Becker), issued May 14, 1991, discloses a shipping tube made of a laminate of paperboard and layers of electrically conductive material on both the inner and outer surface of the paperboard. End caps used therein are also made of conductive material.

U.S. Pat. No. 4,565,288 (Albert Walther), issued Jan. 21, 1986, discloses a tubular container for holding semiconductor components in which guides are provided to prevent contact of the components to the tubular container. 'n one embodiment, the guides are conductive which reduces electrostatic problems. However, because of abrasion between the guides and the package pins during loading, the loading process often causes damage to the package and introduces contamination to the container. U.S. Pat. No. 4,463,851 (Waldo E. Cecil), issued Aug. 7, 1984, discloses a protective enclosure for electronic devices which includes a tube formed from conductive polyvinyl chloride and comprising a bottom wall, side walls and a top wall.

U.S. Pat. No. 4,590,534 (Yoshihiro Akamatsu et al.), issued May 20, 1986, describes a tube-like container for integrated circuits made from laminated sheet with extremely thin (30 to 200 Angstroms thick), transparent conductor covered with plastic. This provides a conductive shield around the circuit package which acts as an electrostatic shield but does not provide electrical contact to the package pins. The inside of the tube is shaped so as to accommodate a dual-in-line semiconductor package. These containers are expensive and often do not provide adequate protection against damage from electrostatic discharge.

A number of references disclose flatpack-type packages and are cited as of general interest. These references are U.S. Pat. No. 5,109,981 (Roy E. Maston lll et al.), issued May 5, 1992; U.S. Pat. No. 5,012,924 (Robert H. Murphy), issued May 7, 1991 and U.S. Pat. No. 5,108,299 (David V. Cronin), issued Apr. 28, 1992.

It is desirable to provide a shipping container or rail for a plurality of circuit packages which provides good protection against damage from electrostatic discharge, lends itself to convenient and efficient shipping and handling, and can be loaded and unloaded without damage or contamination from abrasion between circuit package and tubular container. Also desirable is a shipping container that can be loaded and unloaded by machine and is extremely inexpensive.

SUMMARY OF THE INVENTION

Viewed from one aspect, the present invention is directed to apparatus for housing a plurality of circuit packages which each have at least two rows of conductors protruding therefrom comprising a housing with a shape such as to accommodate the circuit packages so that they can slide along the length of the container and having conductive means on portions of the walls of the apparatus located in such a position that when the circuit packages are placed in the housing and the apparatus is closed, the conductive means are in electrical contact with each row of conductor pins of the circuit packages and the packages are held securely in place. A preferred embodiment is a housing for integrated circuits packaged in dual-in-line plastic packages or dual-in-line ceramic packages in which the housing has a hump like structure which runs down the center of the container to accommodate the packages and provides a rail for the packages to slide along when being inserted or removed from the container. The housing typically is sufficiently long to accommodate a plurality of packages and may be made of insulating or conducting material. The container may or may not be equipped with end caps to enclose the ends of the container.

In one embodiment there are electrical connections between various conductive means in the apparatus so that all rows of pins are electrically connected together. This may be accomplished by use of conducting material in the fabrication of the container or providing a conducting material (such as a strip of metal) between the conductors on each side wall of the container. Conductive means may be provided in a variety of ways including strips of metals or other conductive material or use of the material from which the apparatus is made where that material is conductive. In another preferred embodiment, conductive foam is used as the conductor on each side wall of the container. This provides not only electrical contact between the pins in each row but also is a convenient way of holding the circuit packages in place and minimizes contamination from abrasion of the pins against carbon impregnated plastic. Often, conducting cement is used to adhere conductive foam to each side wall of the container. The container is highly advantageous in that it is easily loaded and unloaded, provides excellent protection against damage from electrostatic discharge and is extremely inexpensive.

View from an other aspect, the present invention is directed to apparatus useful for housing a plurality of packages which each have a plurality of conductors protruding therefrom. The apparatus comprises a housing which comprises walls that define a cavity within the apparatus which has dimensions that facilitate placing and storing the packages in the apparatus, and conductive means on portions of the walls for selectively making electrical contact with the conductors. The apparatus is adapted to have an open position which facilitates placing the packages therein without the conductors having to contact the portions of the walls which have the conductive means thereon, and is further adapted to have a closed position which results in packages that have been placed in the apparatus being held in place and the conductors making electrical contact with the conductive means.

View from still another aspect, the present invention is directed to apparatus useful for housing a plurality of circuit packages which each have at least a row of conductors protruding therefrom. The apparatus comprises a housing and conductive means. The housing comprises walls that define a cavity within the apparatus which has dimensions that facilitate placing and storing the circuit packages in the apparatus. The apparatus is adapted to have an open position which facilitates placing the circuit packages therein without the conductors having to contact the walls of the apparatus, and is adapted to have a closed position which results in circuit packages that have been placed in the apparatus being held in place. The conductive means is on portions of the walls of the apparatus and serves to make electrical contact with the conductors and to hold the circuit packages in place within the apparatus when same is in the closed position.

The invention will be better understood from the following more detailed description taken with the accompanying drawings and claims.

The drawings are not necessarily to scale.

DETAILED DESCRIPTION

Figure 1:
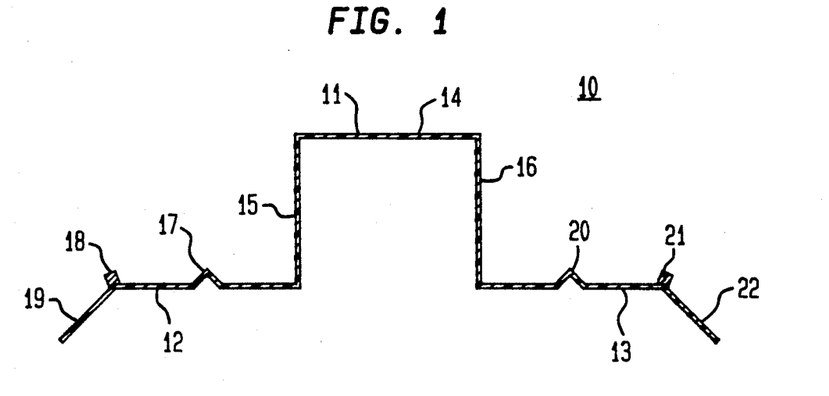
FIG. 1 shows an end view of the bottom portion of a tubular container in accordance with the present invention.
Figure 2:
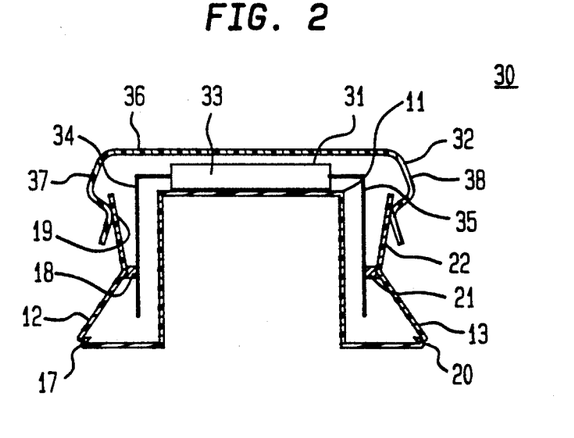
FIG. 2 shows an end view of a tubular container in accordance with the present invention which includes the bottom portion shown in FIG. 1 and a top portion, and has a packaged circuit housed (stored) therein.

Referring now to FIGS. 1 and 2, there are shown end views of a bottom part 10 (shown in FIG. 1) of a tubular container (apparatus) 30 (shown in FIG. 2) and of the container 30 in accordance with the present invention with a plurality of packaged circuits 31 (e.g., dual-in-line packages containing an integrated circuits) contained (stored) therein. Each packaged circuit 31 (see FIG. 2) is a U-shaped member which comprises a body portion 33 which contains, for example, an electrical circuit (not shown) that is connected to first and second arrays of parallel conductor pins 34 and 35. Each packaged circuit 31 has a U-shape. The bottom part 10 of the tubular container 30 comprises a hump-like structure 11 running along the length of the tubular container 30. On each side of the hump-like structure 11 are separate left 12 and right 13 wing members which run along the length of the structure 11 and are attached to bottom portions thereof.

Typically, the hump-like structure 11 has a shape suitable to accommodate a packaged circuit to be housed (stored) in the container 30. For dual-in-line plastic (DIP) packages and dual-in-line ceramic (DIC) packages, the hump-like structure 11 is U-shaped and comprises a top wall 14 joined to left 15 and right 16 side walls at approximately right angles to the top wall 14 with the left 15 and right 16 side walls joined to left 12 and right 13 wing structures, respectively, at bottoms of the side walls 15 and 16 and at right angles to the side walls 15 and 16. The left wing member 12 comprises a hinge 17 (typically a clam-shell type hinge) running parallel to the hump-like structure 11, and a conductive strip 18 running parallel to the hinge 17. An outside part 19 of the left wing member 12 slants downward typically at an angle of about 45 degrees to the horizontal to facilitate closing of the tubular container 30 (shown in complete form in FIG. 2) and to insure that the conductive strip 18 pushes against and electrically contacts the pins 34 and 35 of the packaged circuits 31 shown in FIG. 2. Similarly, the right wing member 13 comprises a hinge 20 running parallel to the hump-like structure 11 and a conducting strip 21, again running parallel to hinge 20 and hump-like structure 11. An outer portion 22 of the right wing member 13 slants downward typically about 45 degrees to the horizontal to facilitate closing of the container 30 and to insure that the conductive strip 21 pushes against and electrically contacts the pins 35 of the packaged circuit 31 (DIP or DIC) housed in the container 30.

The container 30 may be made of insulating material (plastic, paper, etc.,) or conducting material (e.g., paper laminated with metal foil, carbon impregnated plastic, etc.) or a plastic surface treated to make the surface antistatic. The conductive strips 18 and 21 may be a variety of materials such as conductive plastic, metal or conductive foam. Conductive foam is often preferred because it not only electrically connects the arrays of pins 34 and 35, but also applies suitable pressure to the pins 34 and 35 to keep the packaged circuits 31 securely in place without damaging them. Also, any abrasive action of the pins 34 and 35 against the foam does not lead to contamination problems as might be the case with carbon impregnated plastic.

The tubular container 30 of FIG. 2 is shown with the packaged circuit 31 (dual-in-line packages in this case) housed (stored) within container 30. The container 30 comprises the bottom part 10 shown in FIG. 1 and a top part 32. The packaged circuits 31 are aligned along the tubular container 30. The left 12 and right 13 wings of the bottom part 10 of the tubular container are bent along the hinges 17 and 20 so that the left 18 and right 21 conductive strips press against and make electrical contact with the left 34 and right 35 arrays of conductor pins, respectively, of the packaged circuits 31. The top part 32 of the tubular container 10 comprises a flat wall 36 running along the length of the container 30 and parallel to the top wall 14 of the hump-like structure 11. Left 37 and right 38 sides of the top part 32 are convoluted inward so as to hold left 12 and right 13 wing structures against the left 34 and right 35 conductive pins of the packages 31. The left 18 and right 21 conductive strips are typically made of conducting polymer, laminated metal or a conductive foam.

The tubular container 30 may or may not be fitted with end caps (not shown) to completely enclose the container 30. Unless required for a particular application (e.g., where the packaged circuits are particularly susceptible to contamination), end caps are typically not used so as to keep cost low.

Figure 3:
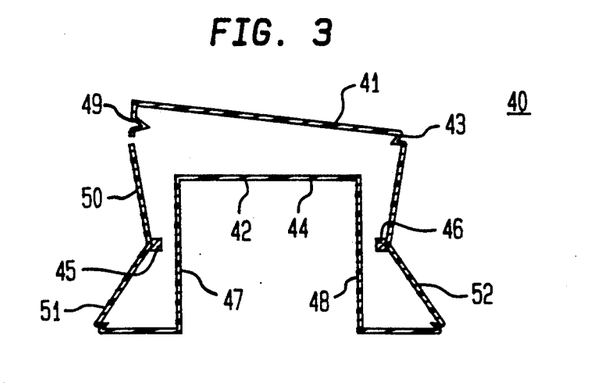
FIG. 3 shows an end view of a one piece tubular container in accordance with the present invention.

Referring now to FIG. 3, there is shown an end view of a tubular container (apparatus) 40 in accordance with the present invention. Container 40 is similar to container 30 of FIG. 2 but is a single piece in which a top portion 41 is attached to a bottom portion 42 by means of a hinge 43 on a right side of the tubular container 40 which runs along the length of the tubular container 40 and parallel to a hump-like structure 44 thereof. The container 40, which is U-shaped so as to facilitate insertion and storage of a U-shaped packaged circuits therein, is shown in an open position and without any packaged circuit stored therein. Left 45 and right 46 conducting strips are located on left 51 and right 52 angled sides respectively of the tubular container 40. The left 45 and right 46 conducting strips run along the length of the container 40 and parallel to left 47 and right 48 walls of the hump-like structure 44. The conducting strips 45 and 46 may be made of conducting polymer, laminated metal or other conducting material. Particularly convenient is conducting foam which electrically connects the pins together and at the same time holds the packaged circuits in place. The container 40 is closed by pushing a protruding element 49 on the left side of the top portion 41 over a winged portion 50 of the left side 51 of the bottom portion 42 of the container 40. This causes sides 51 and 52 to move towards each other and thus causes conducting strips 45 and 46 to move closer to sides 47 and 48, respectively. A U-shaped packaged circuit (not shown) placed in container 40 when it is in the open position has pins thereof which are physically and electrically contacted by conducting strips 45 and 46 when container 40 is in the closed position.

Figure 4:
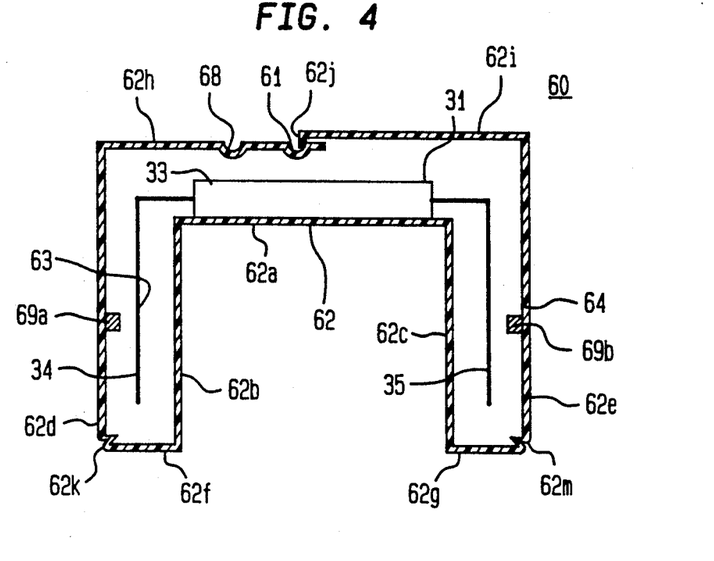
FIG. 4 shows an end view of another one piece tubular container in accordance with the present invention with a packaged integrated circuit stored therein.

Referring now to FIG. 4, there is shown an end view of a single piece tubular container (apparatus) 60 in accordance with the present invention with packaged circuits 31 housed (stored) therein. Each of packaged circuits 31 comprises a body portion 31 with parallel arrays of conductive pins 34 and 35 protruding therefrom. Container 60 is a U-shaped member comprising a hump-like structure 62 having a flat wall 62a which is adapted to have body portions 33 of packaged circuit 31 rest thereon, inside vertical walls 62b and 62c which are perpendicular to wall 62a, outside vertical walls 62d and 62e, electrical contacts 69a and 69b attached to walls 62d and 62e, respectively, bottom horizontal walls 62f and 62g which connect walls 62b and 62d and walls 62c and 62e, respectively, a first top horizontal wall 62h having first 61 and second 68 depressions therein and being connected to wall 62d, and a second horizontal top wall 62i having a protrusion 62 on one end thereof and being connected to wall 62e at a second end thereof. Walls 62d and 62f are joined by a hinge like configuration 62k; and walls 62g and 62e are joined by a hing-like configuration 62m.

With protrusion 62j inserted into depression 61, container 60 is in an "open" position and packaged circuits 31 can be easily slide over hump-like structure 62 without pins 34 and 35 thereof contacting any portion of container 60. This is the position which is shown in FIG. 4. When protrusion 62j is inserted into depression 68, container 60 is in a "closed" position and packages 31 are held in place within container 60 by contacts 69a and 69b which are forced into physical and electrical contact with pins 34 and 35, respectively, as walls 62d and 62e bend inward (not shown). The closed position is not shown.

Conductors 69a and 69b are preferably formed of conducting foam because conductive foam keeps packaged circuits 31 in place without applying excessive force which might damage them.

Figure 5:
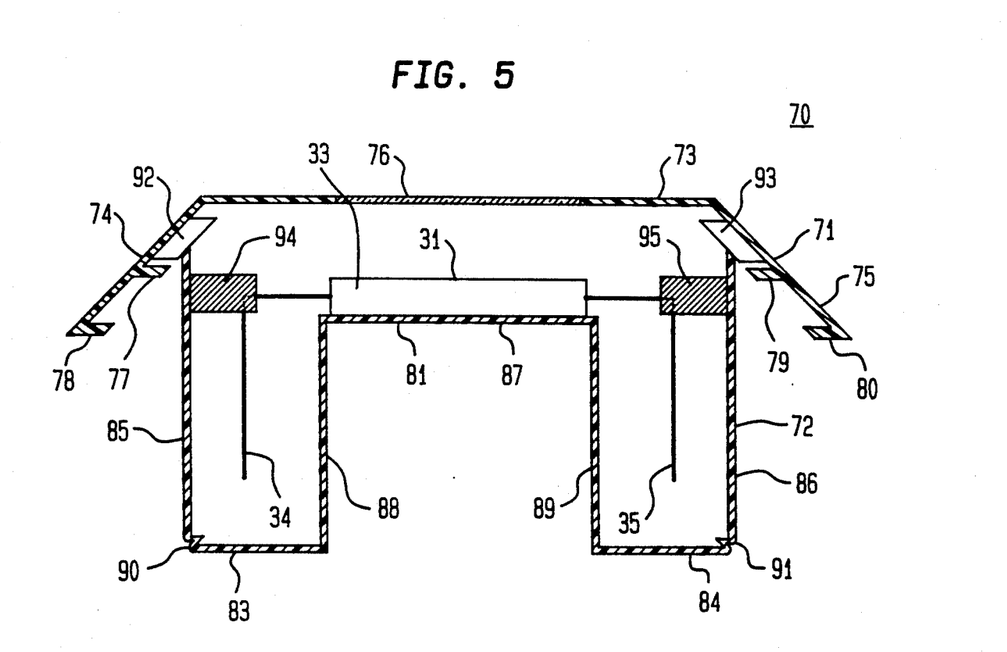
FIG. 5 shows an end view of a two piece tubular container in a "closed" position in accordance with the present invention with a packaged circuit housed (stored) therein.

Referring now to FIG. 5, there is shown an end view of a tubular container (apparatus) 70 which is particularly easy to make and extremely inexpensive and which is in accordance with the invention. The tubular container 70 comprises a top part 71 and a bottom part 72. The tubular container 70 is shown assembled with packaged circuits 31, which each have a body portion 33 and parallel arrays of conductive pins 34 and 35, housed in the container 70.

The top part 71 of the container 70 comprises a top wall 73 which runs along the length of the tubular container 70, and left 74 and right 75 wing walls which run along the length of the tubular container 70 and are attached at each long edge of the top wall 73 at an angle of about 45 degrees from the plane of the top wall 73. The top wall 73 defines a window 76 which is located in the middle thereof and runs along the length thereof. Each wing wall 74,75 comprises two separated protrusions 77 and 78 for the top and bottom protrusions, respectively, of the left wing wall 74, and 79 and 80 for the top and bottom protrusions, respectively, of the right wing wall 75 which serve as latches to close or partially close the container 70.

The bottom part 72 of the tubular container 70 comprises a hump-like structure 81 which is adapted to support the packaged circuits 31, left 83 and right 84 bottom walls, and left 85 and right 86 side walls.

Container 70 is shown in a closed position with the packaged circuits 31 stored therein. The hump-like structure 81 comprises a top wall 87 which runs parallel to the top wall 73 of the top part 71 of the tubular container 70, and left 88 and right 89 side walls which run parallel to the side walls 85 and 86 of the bottom part 72. Top edges of the left 88 and right 89 side walls, which are at right angles to the top wall 87 and to left 83 and right 84 bottom walls, are attached to a left and a right edge of the top wall 87, respectively, and to inside edges of the left 83 and right 84 bottom walls, respectively. Hinges 90 and 91, which are typically clam-shell type hinges, join the outside edges (90 for left and 91 for right) of the left 83 and right 84 bottom walls to the bottom edge of the left 85 and right 86 side walls, respectively. The hinges 90 and 91 retain some spring and the side walls 85 and 86 are locked in place (thereby closing the container) by pushing a left knob 92 connected to an end of wall 85 and a right 93 knob structure connected to an end of wall 86 behind the left 77 and right 79 top protrusions, respectively. Thus, in the closed position, the left knob structure 92 is located between the top protrusion 77 of the left wing wall 74 and the top wall 73, and the right knob structure 93 is located between the top protrusion 79 of the right wing wall 75 and the top wall 73. This locks the tubular container 70 closed so that left 94 and right 95 electrically conductive sponges push against left 34 and right 35 arrays of pins, respectively, on the packages 31 and thus electrically connects each pin 34, 35 in a particular row together and holds the packaged circuits 31 firmly in place.

Two lower protrusions 78 and 80 on the left 74 and right 75 wing structures, respectively, are used to partially close the tubular container 70 so the packaged circuits 82 may be slipped along the hump-like structure 81 (e.g., to load or unload the packages 31), and so that the left 94 and right 95 conducting sponges do not touch the left 34 and right 35 pins and the pins 34 and 35 are not electrically connected together. For purposes of the application, this partially closed position may be referred to as an "open" position. In "open" position, left knob structure 92 is located between top 77 and bottom 78 protrusions of the left wing wall, and the right knob structure 93 is located between the top 79 and bottom 80 protrusions of the right wing wall 75. This is useful for example when the circuit packages 31 are being tested and for loading and unloading the packaged circuits 31 since they can be placed in container 70 without pins 34 and 35 contacting container 70.

Figure 6:
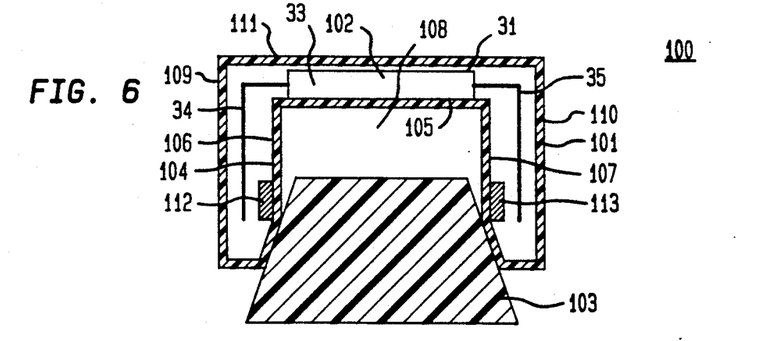
FIG. 6 shows an end view of another tubular container in an "open" position in accordance with the present invention with a packaged circuit housed (stored) therein.

Referring now to FIG. 6, there is shown an end view of another tubular container (apparatus) 100 made in accordance with the present invention. The tubular container 100 is shown in an open position and comprises a main portion 101 and a plug 103. Packaged circuits 31, each having a body portion 33 and pins 34 and 35, are shown stored in container 100. The main portion 101 comprises a hump-like structure 104 comprising an inside top wall 105 and left and right inside walls 106 and 107, respectively. Each of two end edges of the top inside wall 105 of the hump like structure is attached to the left 106 and right 107 inside walls, respectively, of the hump-like structure to form a recess 108 into which the plug 103 is inserted. When the container 100 is in the open position, the plug 103 is not fully inserted into the recess 108 so that the left 106 and right 107 inside walls are not bent outwardly. The main portion 101 further comprises left and right outside walls 109 and 110, respectively, and outside top wall 111 arranged to form an enclosure around the circuit packages 102. Left and right conducting strips 112 and 113, respectively, are attached to the outside part of the left and right inside walls 106 and 107, respectively, of the hump-like structure 104. In the open position strips 112 and 113 do not contact the pins 34 and 35, respectively, of the packaged circuit 31. Accordingly, packaged circuits 31 can be inserted in container 100 when it is in the open position without the pins 34 and 35 contacting container 100.

Figure 7:
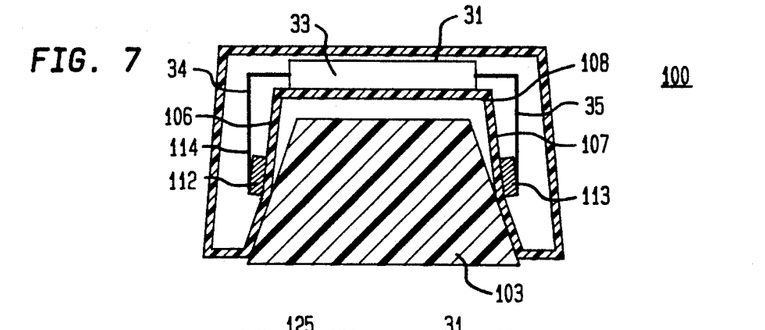
FIG. 7 shows an end view of the container of FIG. 6 in a "closed" position in accordance with the present invention.

Referring now to FIG. 7, there is shown the tubular container (apparatus) 100 of FIG. 6 in a closed position in accordance with the invention. The plug 103 has been further inserted into the recess 108 then is the case in the open position shown in FIG. 6 so as to force outward the left 106 and right 107 inside walls outward and thus force conducting strips 112 and 113 to make physical and electrical contact with contact pins 34 and 35, respectively, and to hold packaged circuits 31 placed within container 100.

Figure 8:
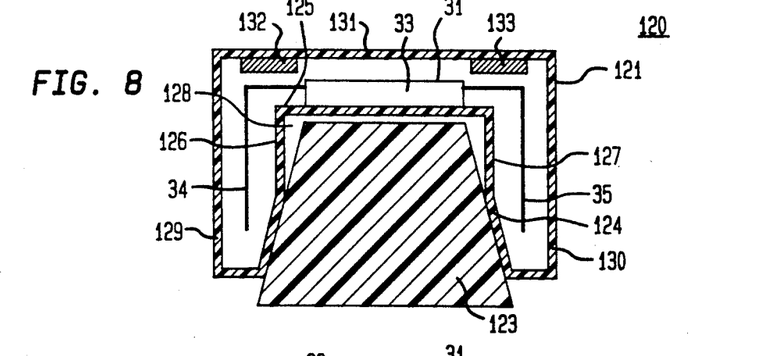
FIG. 8 shows an end view of another tubular container in an open position in accordance with the present invention with a packaged circuit housed (stored) therein.

Referring now to FIG. 8, there is shown an end view of another tubular container (apparatus) 120 made in accordance with the present invention. The tubular container 120 is shown in an open position with packaged circuits 31 stored therein and comprises a main portion 121 containing the circuit packages 31 and a plug 123. Each packaged circuit 31 comprises a body portion 33 and parallel arrays of conductive pins 34 and 35. The main portion 121 comprises a hump-like structure 124 comprising an inside top wall 125 and left and right inside walls 126 and 127, respectively. Each edge of the top inside wall 125 of the hump-like structure is attached to the left 126 and right 127 inside walls of the hump-like structure to form a recess 128 into which the plug 123 is inserted. With container 120 in the open position, the plug 123 is not fully inserted into the recess 128 so that the top inside wall 125 is not pushed upward. The main portion 121 further comprises left and right outside walls 129 and 130, respectively, and outside top wall 131 arranged to form an enclosure around the packaged circuits 31. Left and right conducting strips 132 and 133, respectively, are attached to an inside part of the outside wall 131 on a left and a right side of an inside surface thereof. In the open position, the conductor strips 132 and 133 do not contact the left and right arrays of conductor pins 34 and 35, respectively, of the packaged circuits 31 and thus facilitate the placing of packaged circuits 31 into container 120 with pins 34 and 35 contacting container 120.

Figure 9:
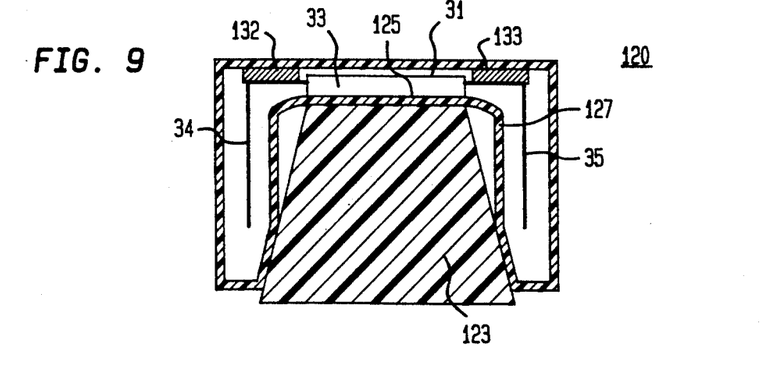
FIG. 9 shows an end view of the tubular container of FIG. 8 in a "closed" position in accordance with the present invention.

Referring now to FIG. 9, there is shown the tubular container 120 of FIG. 8 in a closed position in accordance with the invention. The plug 123 has been further inserted into the recess 128 to force upward the inside top wall 125 so as to move the pins 34 and 35 of the packaged circuits 31 into electrical contact with the left 132 and right 133 conducting strips, respectively. This electrically connects the conductor pins 34 and 35 in each array together and holds the packaged circuits 31 in place.

Figure 10:
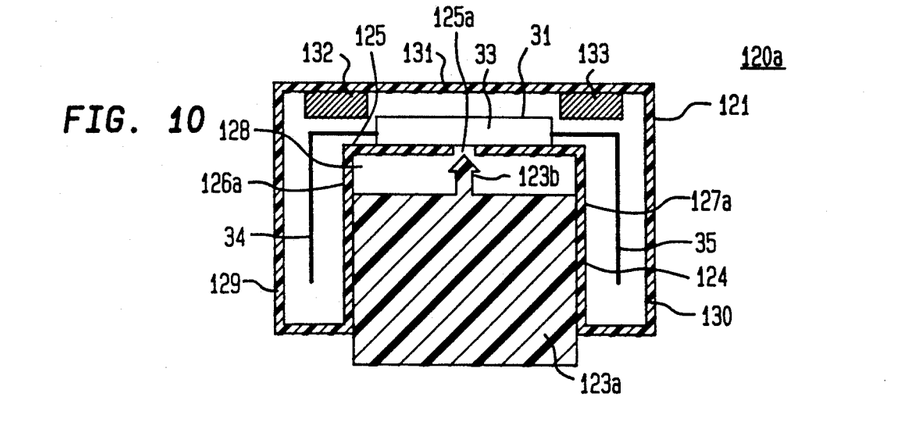
FIG. 10 shows a cross sectional view of the tubular container in an open position in accordance with another embodiment of the invention.

Referring now to FIG. 10, there is shown an end view of another tubular container (apparatus) 120a made in accordance with the present invention. The tubular container 120a is shown in an open position with packaged circuits 31 stored therein and comprises a main portion 121 containing the circuit packages 31 and a plug 123. Apparatus 120a is very similar to apparatus 120 of FIG. 8 and similar components have the same reference numbers. A first difference between apparatus 120a and apparatus 120 of FIG. 8 is that wall 125 has an aperture 125a therethrough which is located such that with circuit packages 31 placed therein, the aperture 127a is below a bottom portion of each circuit package 31. A second difference between apparatus 120a and apparatus 120 of FIG. 8 is that plug 123a has an essentially rectangular cross-section and further comprises an arrow like protrusion 123b which is positioned on plug 123a such that when apparatus 120a is in the open position, protrusion 123a is below aperture 125a. Plug 123 of container 120 of FIGS. 8 and 9 has a trapezoidal cross-section. Other differences are that sidewalls 126a and 127a are parallel straight walls whereas walls 126 and 127 of container 120 of FIGS. 8 and 9 each have a straight upper portion and a lower portion which is attached thereto at an angle.

Figure 11:
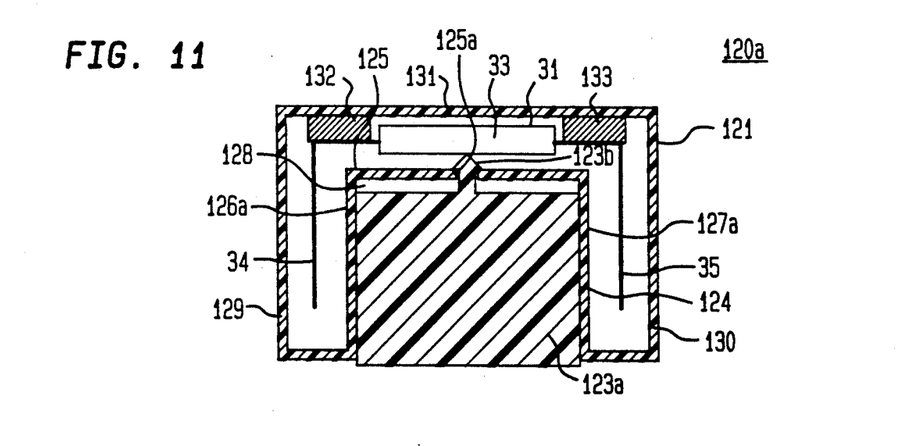
FIG. 11 shows a cross sectional of a tubular container of FIG. 10 in a "closed" position.

Referring now to FIG. 11, there is shown the tubular container 120a of FIG. 10 in a closed position in accordance with the invention. The plug 123a has been further inserted into the recess 128 to force upward the protrusion 123b such that it passes through aperture 125a and forces packaged circuits 31 upward so as to move the pins 34 and 35 of the packaged circuits 31 into electrical contact with the left 132 and right 133 conducting strips, respectively. This electrically connects the conductor pins 34 and 35 in each array together and holds the packaged circuits 31 in place.

The principles of the present invention are particularly useful when incorporated in a hollow tubular container, generally six inches to several feet long for housing (storing) a number of circuit packages. Both insulating and conducting material may be used to construct the tubular containers including paper, cardboard, plastic, metal-paper laminates etc. Extruded polyvinylchloride or vacuum formed polymer yield excellent results. Also, materials such as plastic which have been surface treated to make them antistatic are useful. Choice of material often depends on the nature of the circuit package being stored in the container and the degree of protection needed for that package. Electrically conductive regions may be made by deposition (e.g., vacuum deposition) of conductive material on the region of interest or adhering conductive material to the region of interest. The use of conductive foam yields exceptionally good results because the conductive foam electrically connects the pins together and also holds the packages electrical components tightly in place during shipping and handling.

The conducting strips which electrically connect the pins in each row together may or may not be electrically connected together. This often depends on the nature of the circuit package being housed in the tubular container and the degree of antistatic protection required. Where the conducting strips are to be electrically connected together, this may be done by using conducting material in the construction of the container or providing a conducting path between conducting strips. Often, where end caps are used, the conducting path may be incorporated in the end caps. Preferred is the use of conducting plastic in the fabrication of the tubular container.

It is to be appreciated and understood that the specific embodiment of the invention described herein above are merely illustrative of the general principles of the invention. Various modifications may be made by those skilled in the art which are consistent with the principles set forth herein. For example, various hinge arrangements may be used and various latching arrangements may be used in the practice of the invention.

Still further, various shapes may be used to support packages containing electrical devices housed in the tubular container. Still further, a packaged circuit having a single row of conductors (denoted as a single in-line package, a SIP) protruding therefrom can also be housed in tube which has a single recess with conductors on a wall thereof. Furthermore, packages having multiple arrays of conductors protruding therefrom may be housed in a modified apparatus made in accordance with the principles of the present invention.

What is claimed is:

1. Apparatus useful for housing a plurality of dual-in-line circuit packages which each have a main body comprising electronic circuitry and two approximately parallel arrays of conductor pins protruding therefrom with each conductor pin having inner and outer sides, the apparatus comprising:
   a housing which comprises a bottom piece and a top piece that define a cavity within the apparatus which has dimensions that facilitate placing and storing the circuit packages in the apparatus;
   the bottom piece comprising a hump-like structure attached to left and right bottom walls, said left and right bottom walls being attached to left and right outside walls, respectively, and the left and right outside walls each comprising an inside surface and a top edge;
   the top piece comprising a top wall and left and right oblique side walls attached to left and right edges, respectively, of the top wall and extending downward from a plane of the top wall at approximately 45 degrees, each oblique side wall comprising a bottom and top protrusion;
   the apparatus being adapted to have an open position with the top edge of the left outside wall located between the bottom and top protrusion of the left oblique side wall and the top edge of the right outside wall located between the bottom and top protrusions of the right oblique side walls so as to facilitate placing of the circuit packages therein without the conductor pins having to contact the walls of the apparatus and in which the hump-like structure has a width less than the spacing between each parallel array of pins, and being adapted to have a closed position with the top edge of the left outside wall located between the top protrusions of the left oblique side wall and the top wall of the top piece and the top edge of the right outside wall located between the top protrusion of the right oblique side wall and the top wall of the top piece such that the circuit packages that have been placed in the apparatus are held in place; and
   conductive means on portions of the walls of the apparatus for making electrical contact with the outer sides of the conductor pins and for holding the circuit packages in place within the apparatus when same is in the closed position, said conductive means being attached to the inside surfaces of the left and right outside walls.

2. The apparatus of claim 1 in which the conductive means comprises a conductive material.

3. The apparatus of claim 2 in which the conductive material comprises conductive foam.

4. The apparatus of claim 2 in which the conductive material comprises a metal.

* * * * *